(12) United States Patent
Shao et al.

(10) Patent No.: US 9,825,584 B2
(45) Date of Patent: Nov. 21, 2017

(54) SAMPLING DURATION CONTROL FOR POWER TRANSFER EFFICIENCY

(71) Applicant: Analog Devices, Inc., Norwood, MA (US)

(72) Inventors: Bin Shao, Shanghai (CN); Yanfeng Lu, Shanghai (CN); Hua-Jung Yang, Santa Clara, CA (US)

(73) Assignee: Analog Devices, Inc., Norwood, MA (US)

( * ) Notice: Subject to any disclaimer, the term of this patent is extended or adjusted under 35 U.S.C. 154(b) by 835 days.

(21) Appl. No.: 14/098,181

(22) Filed: Dec. 5, 2013

(65) Prior Publication Data

US 2015/0123649 A1 May 7, 2015

Related U.S. Application Data

(63) Continuation of application No. PCT/CN2013/086672, filed on Nov. 7, 2013.

(51) Int. Cl.
*G01R 21/00* (2006.01)
*H02S 50/00* (2014.01)
*G01R 19/25* (2006.01)

(52) U.S. Cl.
CPC .......... *H02S 50/00* (2013.01); *G01R 19/2509* (2013.01)

(58) Field of Classification Search
CPC ............................ H02S 50/00; G01R 19/2509
(Continued)

(56) References Cited

U.S. PATENT DOCUMENTS 4,604,567 A * 8/1986 Chetty .................. G05F 1/67
136/293
5,869,956 A 2/1999 Nagao et al.
(Continued)

FOREIGN PATENT DOCUMENTS

CN 102354110 A 2/2012
CN 102902298 A 1/2013
(Continued)

OTHER PUBLICATIONS

Ahmad, Jawad, et al., "A Voltage Based Maximum Power Point Tracker for Low Power and Low Cost Photovoltaic Applications", *World Academy of Science, Engineering and Technology*, 60, (2009), 712-715.
(Continued)

*Primary Examiner* — Billy Lactaoen
(74) *Attorney, Agent, or Firm* — Schwegman Lundberg & Woessner, P.A.

(57) ABSTRACT

Apparatus and techniques for controlling measurement of an electrical parameter of an energy source can be used to obtain information for use in enhancing a power transfer efficiency between the energy source and a load. For example, during a first measurement cycle, information indicative of the electrical parameter of the energy source can be obtained using a measurement circuit during a first sampling duration in which the load is decoupled from the energy source. The information indicative of the obtained electrical parameter can be compared to a threshold. In response to the comparing, a different second sampling duration can be determined for use in obtaining information indicative of the electrical parameter during a subsequent measurement cycle. The information indicative of the electrical parameter of the energy source includes information
(Continued)

for use in enhancing the power transfer efficiency between the energy source and the load.

23 Claims, 11 Drawing Sheets

(58) Field of Classification Search
USPC .................................................. 324/103 R
See application file for complete search history.

(56) References Cited

U.S. PATENT DOCUMENTS

| 6,111,767 | A | 8/2000 | Handleman |
| 6,339,538 | B1 | 1/2002 | Handleman |
| 8,422,249 | B2 | 4/2013 | Cooper et al. |
| 2013/0043857 | A1 | 2/2013 | Ramadass et al. |
| 2013/0043858 | A1 | 2/2013 | Ramadass et al. |

FOREIGN PATENT DOCUMENTS

| WO | WO-2011/003971 A1 | 1/2011 |
| WO | WO-2013/049184 A2 | 4/2013 |

OTHER PUBLICATIONS

Freeman, Dave, "Introduction to Photovoltaic Systems Maximum Power Point Tracking", Texas Instruments, Application Report, SLVA446—Nov. 2010, (Nov. 2010), 8 pgs.

Mateu, Loreto, et al., "Analog Maximum Power Point Circuit Applied to Thermogenerators", *PowerMEMS 2008*, Sendai, Japan, Nov. 9-12, 2008, (Nov. 2008), 461-464.

Sharama, Prashant, et al., "A MPPT Based Solar Charge Controller", Abstract for Indian Application Serial No. 940DEL2008, filed Apr. 10, 2008, 2 pgs.

Simjee, F. I, et al., "Efficient Charging of Supercapacitors for Extended Lifetime of Wireless Sensor Nodes", *IEEE Transactions on Power Electronics*, 23(3), (May 2008), 1526-1536.

\* cited by examiner

100 ⤴

102 ⤴

SAMPLING DURATION CONTROL FOR POWER TRANSFER EFFICIENCY

CLAIM OF PRIORITY

This application is a continuation under 35 U.S.C. §111(a) and claims benefit of priority to International Patent Application Serial No. PCT/CN2013/086672, filed on Nov. 7, 2013, which is hereby incorporated by reference herein in its entirety.

BACKGROUND

Electrical energy can be harvested or generated using a variety of techniques. For example, an energy source can include a photovoltaic (PV) device, such as a solar cell or a solar array. Another example of an energy source can include a thermo-electric generator (TEG). Use of a PV device, a TEG, or other energy sources can include coupling such an energy source to a load to provide operating energy for the load. However, there can be a detrimental effect on energy conversion efficiency or power transfer efficiency if the load current or voltage requirements are badly mismatched to the output characteristics of the energy source.

Overview

An energy source can be coupled to a load, such as using a power conversion circuit. The operation of the power conversion circuit can be adjusted using information about the energy source, such as to enhance the efficiency of energy transfer between the energy source and the load. In an example, the energy source can include a photovoltaic (PV) device. In one approach, the power conversion circuit can be configured to isolate (e.g., decouple) the load from the energy source, so that an electrical parameter of the energy source can be measured using a measurement circuit. This can be referred to as obtaining an open-circuit measurement, though the energy source need not literally be physically disconnected from the load or open-circuited. For example, an open-circuit terminal voltage of a PV device can be measured using a fixed (e.g., non-varying) measurement duration where a high impedance is presented across the terminals of the PV device by the measurement circuit. Once the open-circuit voltage is measured, a proportionality constant, (e.g., "K") can be used to establish a desired terminal voltage of the PV device when under load by multiplying a measured open-circuit voltage by the proportionality constant (or by dividing voltage under load by the proportionality constant and comparing to the measured open-circuit voltage). The power conversion circuit can adjust one or more of a frequency or duration of intervals where the load is connected to the PV device, or other operating characteristics, such as to converge on the desired terminal voltage of the PV device under load by adjusting the resistance or impedance presented to the PV device by the power conversion circuit. This approach can be referred to as a "maximum power point tracking" (MPPT) technique based on open-circuit voltage. The phrase "maximum" does not require that this technique always must converge on a maximum efficiency or an operating point of maximum power transfer, but the technique does seek to enhance power transfer efficiency in a direction towards maximum power transfer and can provide operation at a maximum power transfer point. However, measuring open-circuit voltage using a non-varying sampling duration can have drawbacks.

The present inventors have recognized, among other things, that overall system efficiency can be enhanced by varying a measurement duration used for an open-circuit voltage determination. The load is generally decoupled from the energy source during the measurement interval, and in the case of energy sources such as PV or TEG devices, a settling time of the energy source to reach a steady-state open-circuit value may be significant (e.g., seconds), such as due to the large equivalent capacitance of such devices. During this settling time while the load is decoupled from the energy source, the load is generally powered by an energy storage device, such as a battery, capacitor, or super capacitor, for example. In the fixed-measurement-duration approach, the settling time may be established in an overly conservative manner, such as to provide a relatively accurate gauge of open-circuit voltage under a variety of conditions (e.g., differing temperatures, irradiances, load conditions, etc.). This generally results in the load being disconnected for long intervals, and perhaps for a far longer interval than is necessary to adequately estimate an open-circuit voltage of the energy source for particular operating conditions (e.g., load demand prior to decoupling load, temperature, irradiance level in the case of PV device).

If the fixed measurement duration is established too aggressively (e.g., too short a duration), then significant error can exist in a resulting open-circuit measurement, which also degrades efficiency. Accordingly, the present inventors have recognized that dynamic adjustment of the measurement duration (e.g., a sampling duration) can be performed from measurement cycle to measurement cycle, such as to improve efficiency by selecting or establishing a measurement duration having an appropriate amount of settling time for the energy source, but not overly extending or truncating such a measurement duration. In an example, a frequency of measurement cycles (e.g., a time between measurement durations) can also be adjusted dynamically, such as in response to a measured change in one or more of irradiance or temperature in the environment around the energy source In addition, or instead, the proportionality constant, "K," can also be adjusted to enhance power transfer efficiency. For example, K can be adjusted automatically in response to a measured change in one or more of irradiance or temperature in the environment around the energy source. In other examples, K is fixed and established using information about the application environment or known characteristics of the energy source. While the examples discussed herein generally refer to photovoltaic devices and open-circuit voltage measurements, such techniques are applicable to use with other energy sources and using other measurement techniques such as short-circuit current measurements, for example.

In an example, apparatus such as an electrical circuit or an integrated circuit including an electrical circuit, or a method can include controlling measurement of an electrical parameter of an energy source to obtain information for use in enhancing a power transfer efficiency between the energy source and a load. For example, during a first measurement cycle, information indicative of the electrical parameter of the energy source can be obtained using a measurement circuit during a first sampling duration in which the load is decoupled from the energy source. The information indicative of the obtained electrical parameter can be compared with a threshold. In response to the comparing, a different second sampling duration can be determined for use in obtaining information indicative of the electrical parameter during a subsequent measurement cycle. The information indicative of the electrical parameter of the energy source can include information for use in enhancing the power transfer efficiency between the energy source and the load.

Figure 1A:
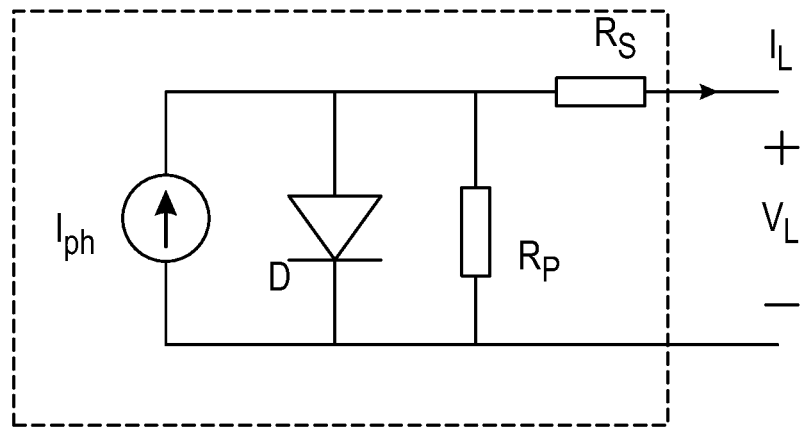
FIG. 1A illustrates generally an example of an equivalent circuit that can model an energy source such as photovoltaic (PV) device.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

FIG. 1A illustrates generally an example of an equivalent circuit 100 that can model an energy source such as photovoltaic (PV) device. A photocurrent produced by the PV device can be modeled as a current, Iph, provided by a current source in parallel with a diode, D. A large shunt resistance (e.g., ohmic leakage) can be modeled using a shunt resistor, $R_P$, and similarly a series resistance can be modeled as $R_S$. Other energy sources can have a similar configuration, or a dual of such a configuration. For example, a thermoelectric generator (TEG) can be modeled using a voltage source coupled to a series resistor. Generally, maximum power transfer would generally occur when a resistance presented by the load is matched to an output resistance of the energy source. An output current at the terminals of the circuit 100 can be represented by $I_L$, and a voltage across the output terminals can be represented by $V_L$.

Figure 1B:
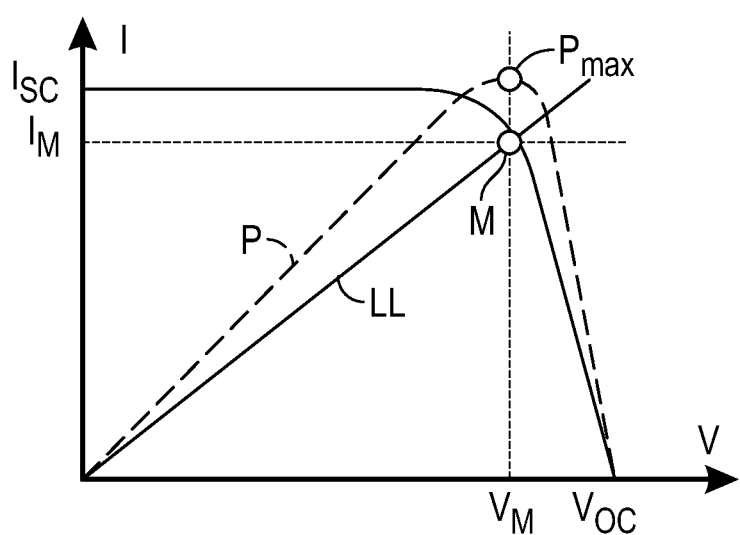
FIG. 1B illustrates generally an illustrative example of a current-voltage relationship for an energy source such as a photovoltaic (PV) device, along with a load line and a corresponding power.

FIG. 1B illustrates generally an illustrative example 102 of a current-voltage (I-V) relationship for an energy source such as a photovoltaic (PV) device, along with a load line, LL, and a corresponding power, P. The I-V relationship can represent the output current, I, in relation to corresponding output voltages at the terminals of the PV device under a variety of load conditions ranging from short-circuited (e.g., providing a short-circuit current, $I_{SC}$), to open-circuited (e.g., providing an open-circuit voltage $V_{OC}$). Ideally, the resistance of a load presented to the energy source would provide the load line LL passing through the maximum power point, M, which corresponds to a point of maximum power output, $P_{MAX}$, of the PV device. In various applications, the actual load may vary substantially from the desired load line. For example, a power conversion circuit can be coupled to the output terminals of the PV device or other energy source such as to adjust a voltage or current to values specified for a particular load.

The power conversion circuit can include a control circuit configured to enhance power transfer efficiency, such as to present a specified resistance or impedance to the PV device or other energy source, thereby seeking out the maximum power point, M. Such control can be referred to as maximum power point tracking (MPPT). For example, the resistance or impedance presented to the PV device or other energy source can be can be varied with respect to time, and can deviate considerably from the impedance presented to the power conversion circuit by the actual application load circuit (e.g., the circuit being supplied power by the power conversion circuit). In various examples, an MPPT technique can include decoupling a load from the energy source, and measuring an open-circuit voltage of the energy source while the load is decoupled. The load can continue to be powered such as using an energy storage device (e.g., a batter or capacitor) to avoid dropout of energy supplied to the load, such as during periods where the energy source is supplying less than the required instantaneous power to sustain the load, or when the energy source is decoupled from the load such as for measurement of an open-circuit voltage at the terminals of the energy source.

Figure 2A:
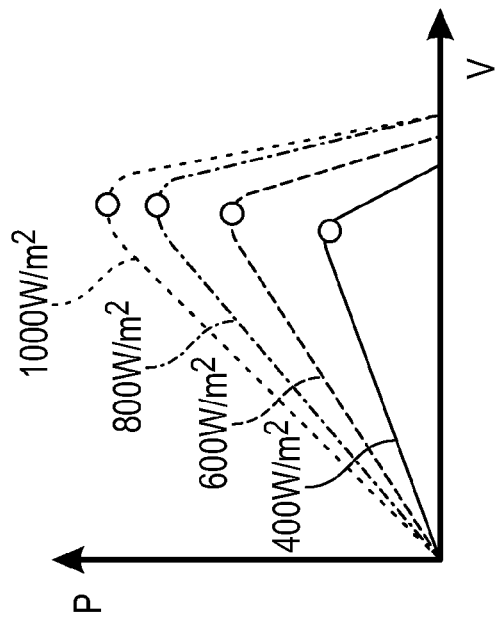
FIGS. 2A through 2B illustrate generally illustrative examples of a current-voltage relationship of a photovoltaic (PV) device under a variety of irradiance conditions (in FIG. 2A) and corresponding power-voltage relationships (in FIG. 2B).
Figure 2B:
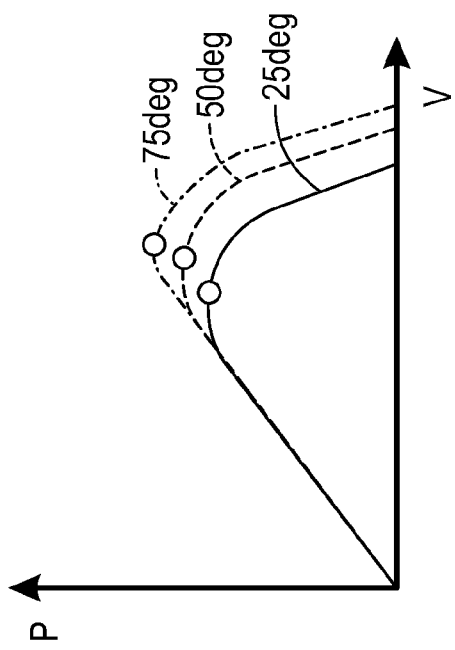

FIGS. 2A through 2B illustrate generally illustrative examples of a current-voltage relationship of a photovoltaic (PV) device under a variety of irradiance conditions (in FIG. 2A) and corresponding power-voltage relationships (in FIG. 2B). The I-V relationships and output power versus terminal voltage of energy storage devices is generally not constant. For example, for PV devices, the I-V relationships and output power versus voltage vary significantly as a function of irradiance, as shown in FIGS. 2A through 2B. This shifts the open-circuit voltage and voltage under load for maximum power transfer. However, a proportion between the output voltage at the points of maximum power transfer (shown as peaks in FIG. 2B) and open-circuit voltage (the x-intercept on the right side) is relatively constant over a range of irradiances.

In practice, such a proportion can be represented by "K," and can be in a range from about 0.6 to about 0.8, such as from about 0.73 to about 0.8. Other energy sources, such as a thermoelectric generator, can have other "K" values. Information about the open-circuit voltage can be measured corresponding to a specified range of irradiances, and can be used along with the K proportion to establish a target output voltage under load to enhance power transfer efficiency and seek out the maximum power point under a variety of irradiance conditions, for example, by adjusting the load presented to the energy source.

Figure 3A:
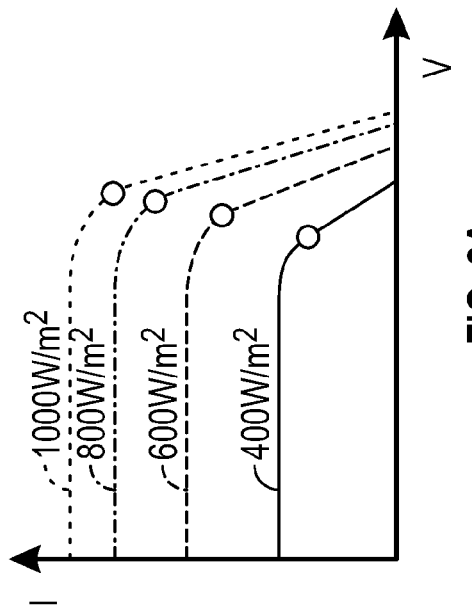
FIGS. 3A through 3B illustrates generally illustrative examples of a current-voltage relationship of a photovoltaic (PV) device under a variety of temperature conditions (in FIG. 3A) and corresponding power-voltage relationships (in FIG. 3B).
Figure 3B:
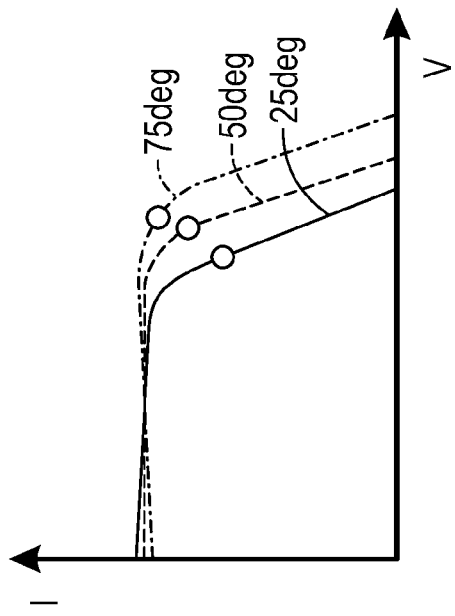

FIGS. 3A through 3B illustrates generally illustrative examples of a current-voltage relationship of a photovoltaic (PV) device under a variety of temperature conditions (in FIG. 3A) and corresponding power-voltage relationships (in FIG. 3B). As in FIGS. 2A and 2B, I-V relationships and output power versus output voltage can vary significantly depending on conditions around the energy source, such as temperature. Again, the "K" proportion between voltage under load at the maximum power point and the open-circuit voltage is relatively constant, and therefore open-circuit voltage can be used along with the K proportion to seek out the maximum power point under a variety of temperature conditions, for example.

Figure 4:
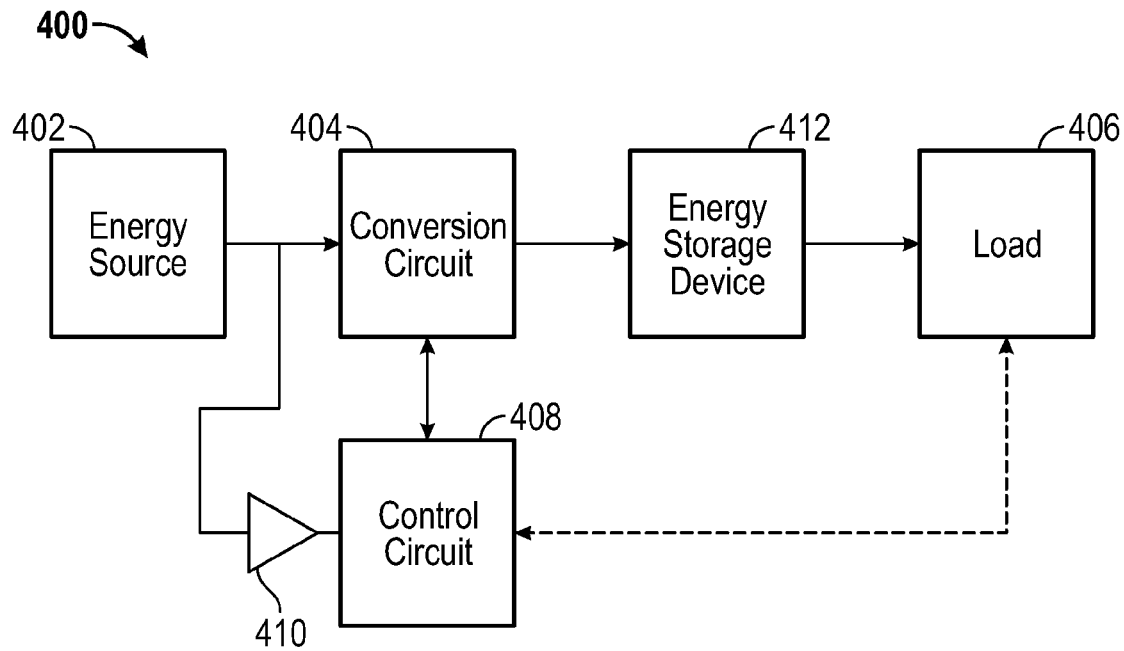
FIG. 4 illustrates generally an example of a system that can include an energy source, an power conversion circuit, a control circuit, an energy storage device, and a load.

FIG. 4 illustrates generally an example of a system that can include an energy source 402, an power conversion circuit 404, a control circuit 408, a measurement circuit 410, an energy storage device 412, and a load 406. In FIG. 4, the energy source can include a photovoltaic (PV) device, a thermoelectric generator (TEG), or another source of electrical energy. The power conversion circuit 404 can be coupled to the energy source, such as including or otherwise coupled to a control circuit 408. The control circuit can use information about the energy source, such as information about an electrical parameter of the energy source 402 obtained using the measurement circuit 410 (e.g., such as shown below in the examples of FIGS. 5 through 6, 8 through 13, or elsewhere). In an example, the control circuit 408 can control the power conversion circuit 404, such as to decouple the load 406 from the energy source 402. The open-circuit voltage of the energy source 402 can then be monitored, such as over a dynamically adjustable sample duration using the measurement circuit 410.

The dynamically-adjustable sample duration can be established at least in part by the control circuit 408 using information obtained from the measurement circuit 410. During intervals where the load 406 is decoupled from the energy source 402, energy can be provided by the energy storage device 412. The power conversion circuit 404 can be operated in a manner to regulate one or more of a voltage or current delivered to the load 406, and the power conversion circuit 406 can adjust a resistance or impedance presented to the energy source 402 such as to enhance an energy transfer efficiency between the energy source 402 and the load 406. For example, a maximum power point tracking (MPPT) technique can include using a dynamically adjustable open-circuit voltage sampling duration.

In an example, the power conversion circuit 404 can include a buck topology, a boost topology, a buck/boost topology or other configuration (e.g., an inverter). In an examples where the power conversion circuit 404 includes a switching regulator configuration, a pulse repetition rate or a pulse width of charging pulses provided by the power conversion circuit to charge the energy storage device 412 can be varied, such as using a portion of the circuit configuration shown in the illustrative example of FIG. 10 to seek out or maintain a target output voltage range at the terminals of the energy source 402, such as for MPPT.

Figure 5:
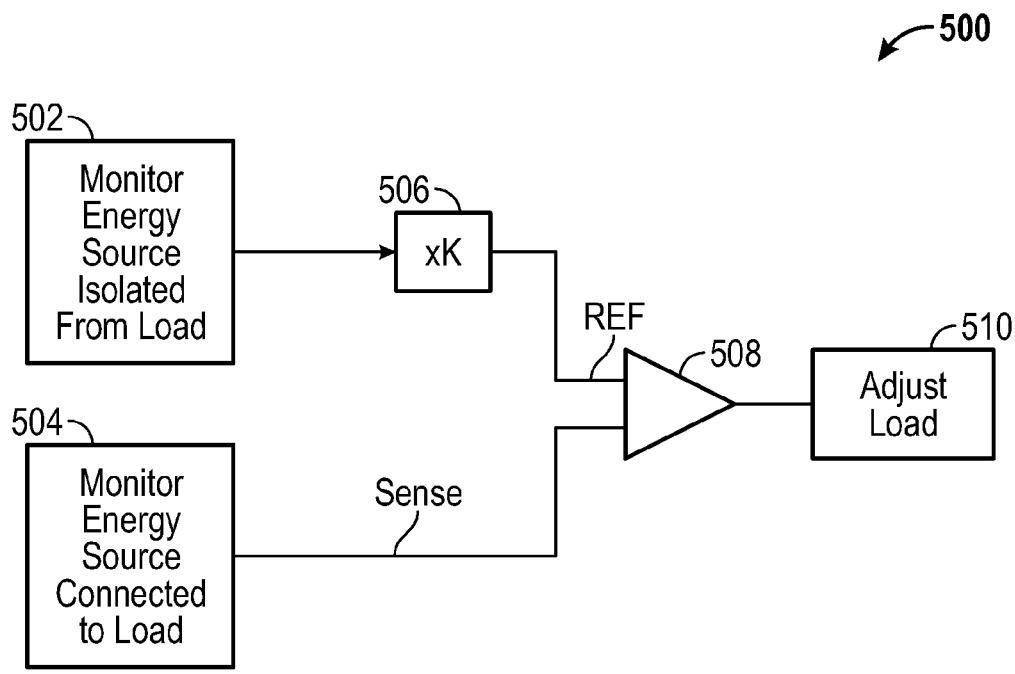
FIG. 5 illustrates generally a technique, such as a method, for enhancing a power transfer efficiency.

FIG. 5 illustrates generally a technique 500, such as a method, for enhancing a power transfer efficiency. At 502, an electrical parameter of an energy source such as a photovoltaic (PV) device or TEG, for example, can be monitored while the energy source is isolated (e.g., decoupled) from a load. The energy source need not literally be physically disconnected from the load at 502. However, a specified high impedance can be presented to the load to approximate an open-circuit condition, and the monitored electrical parameter can include an output voltage. After a settling time, the output voltage will converge on a value approximating the open-circuit voltage of the energy source, for example. At 506, the monitored output voltage can be multiplied by a proportionality constant, "K." The proportionality constant, "K" can be predetermined (such as specified in relation to specific characteristics or end use of a particular energy source), or the "K" value can be determined dynamically such as using information about ambient irradiance, temperature, or other parameters (e.g., using a lookup table or using an analytically-specified relationship to such parameters). The proportionality constant, "K," can refer to a ratio of the output voltage under load of the energy source to an open-circuit voltage, where the voltage under load corresponds to or is nearby a maximum power point of the energy source. The monitored open-circuit voltage times the proportionality constant can be referred to as "REF," and can represent a target operating output voltage for the energy source. REF can be stored, such as sampled using a capacitor, or a digital representation of REF can be determined and stored.

At 504, an electrical parameter of the energy source, such as output voltage, can be monitored while the load is coupled to the energy source. A value representative of the output voltage of the energy source under load can be referred to as SENSE. At 508, a sampled or otherwise stored representation of REF can be compared with SENSE (such as using a comparator circuit), and at 510 the load presented to the energy source 402 can be adjusted. For example, one or more of a charging pulse duration or a pulse repetition rate of a power conversion circuit can be adjusted at least in part using information about the comparison at 508, or other characteristics of the power conversion circuit can be adjusted such as to provide a time-averaged or instantaneous output voltage of the energy source under load, SENSE, that tracks the target output voltage, REF. The scaling at 506 could be located elsewhere to achieve similar effect, such as by dividing the monitored value obtained at 504 by the proportion, K.

Figure 6:
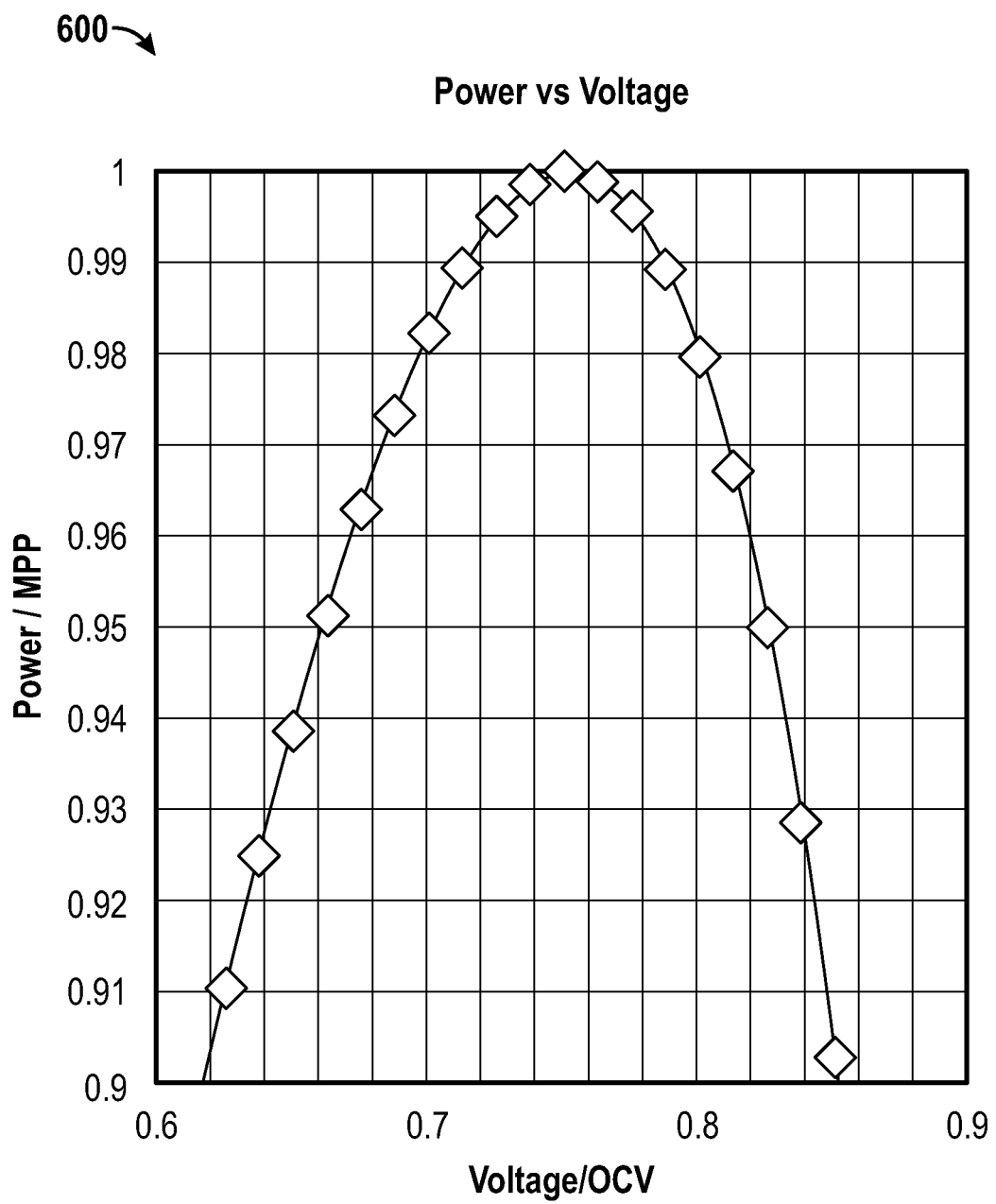
FIG. 6 illustrates generally an illustrative example of a relationship between a ratio of output power under load to a maximum output power point (MPP) plotted versus a ratio of output voltage under load to open-circuit voltage (OCV).
Figure 7A:
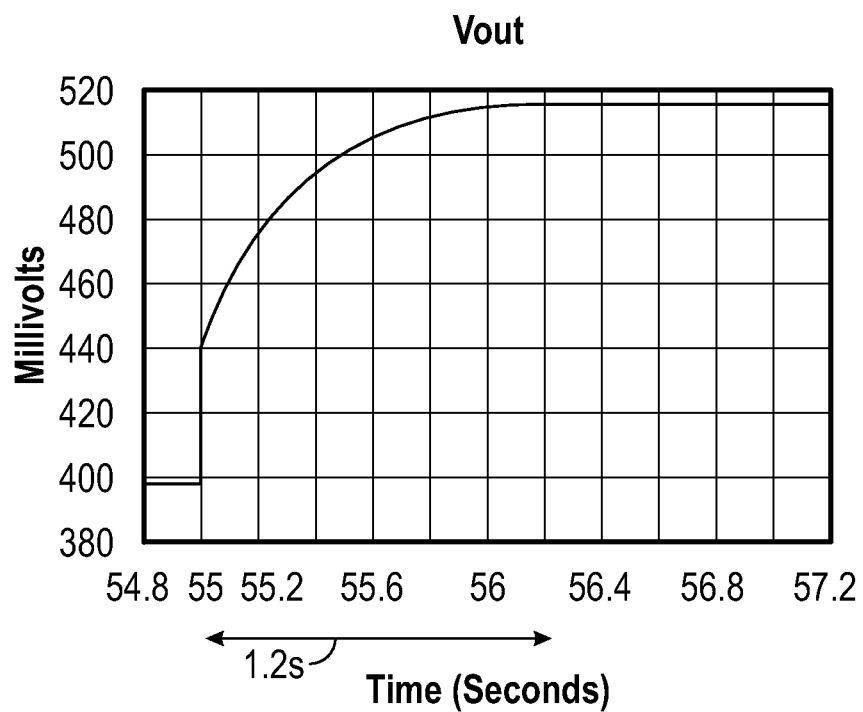
FIG. 7A illustrates generally an illustrative example of a time response of a terminal voltage of a photovoltaic (PV) device, such as in response to decoupling of a load.
Figure 7B:
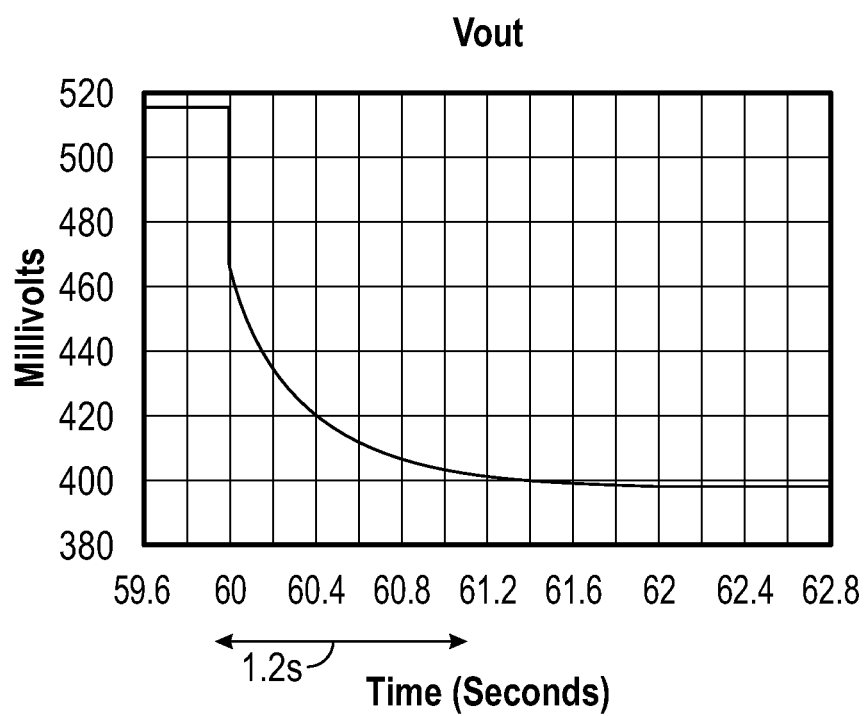
FIG. 7B illustrates generally an illustrative example of a time response of a terminal voltage of a photovoltaic (PV) device, such as in response to coupling of a load.

FIG. 6 illustrates generally an illustrative example of a ratio of output power under load to a maximum output power point (MPP) plotted versus a ratio of output voltage under load to open-circuit voltage (OCV), for an energy source. As mentioned elsewhere, the ratio of output voltage under load to OCV can be used as the proportionality constant, "K," referred to in other examples herein. In the illustration of FIG. 6, a ratio where output power is maximized corresponds to a proportion, "K" of about 0.76. Accordingly, for an energy source presenting a curve similar to the plot of FIG. 6, such as a photovoltaic (PV) device, a power conversion circuit can be controlled such as to adjust the load presented to the PV device so that the output voltage under load is about 0.76 times a measured OCV. However, as shown in FIGS. 7A and 7B, a settling time after coupling or decoupling of the load from a PV device can be in the range of milliseconds to seconds, for example, so obtaining an open-circuit voltage measurement can cause a significant impact on efficiency. Measurement of the open-circuit voltage can present several challenges, such as shown in the examples of FIGS. 7A and 7B, and elsewhere.

FIG. 7A illustrates generally an illustrative example of a time response of a terminal voltage of a photovoltaic (PV) device, such as in response to decoupling of a load. At about 55 seconds, the load is decoupled from the PV device and over a period of about 1.2 seconds, the output voltage of the PV device settles at an open-circuit value. Such a settling time can be dependent on a variety of factors such as the load condition prior to decoupling, irradiance, or temperature, for example. In one approach, a conservative fixed (e.g., non-varying) value for a sampling duration can be selected, such as well beyond the expected settling time in all conditions (e.g., sampling at two seconds out after load decoupling in this illustrative example). However, such a conservative approach can have drawbacks because the load is generally still supplied with energy from an energy storage device while disconnected from the PV device. During the open-circuit voltage measurement, power transfer is inhibited or suppressed. The present inventors have recognized, among other things, that dynamic adjustment of the open-circuit sampling duration can help to improve efficiency. Using such a varying sampling duration can help to minimize the efficiency degradation of duty cycling of the energy source for open-circuit voltage measurement, because such a varying sampling duration is adjusted, such as on a cycle-by-cycle basis, to provide an appropriate settling time that is not unduly truncated or extended.

FIG. 7B illustrates generally an illustrative example of a time response of a terminal voltage of a photovoltaic (PV) device, such as in response to coupling of a load. As in the example of FIG. 7A, the finite output resistance and limited drive current provided by an energy source such as photovoltaic (PV) device can cause a long settling time before the output voltage of the PV device converges back on a steady state value under load (assuming a constant load in this illustration). In an example, a sampling duration established for open-circuit voltage measurement can also be used to specify a minimum delay before sampling a voltage under load when the load is recoupled.

Figure 8:
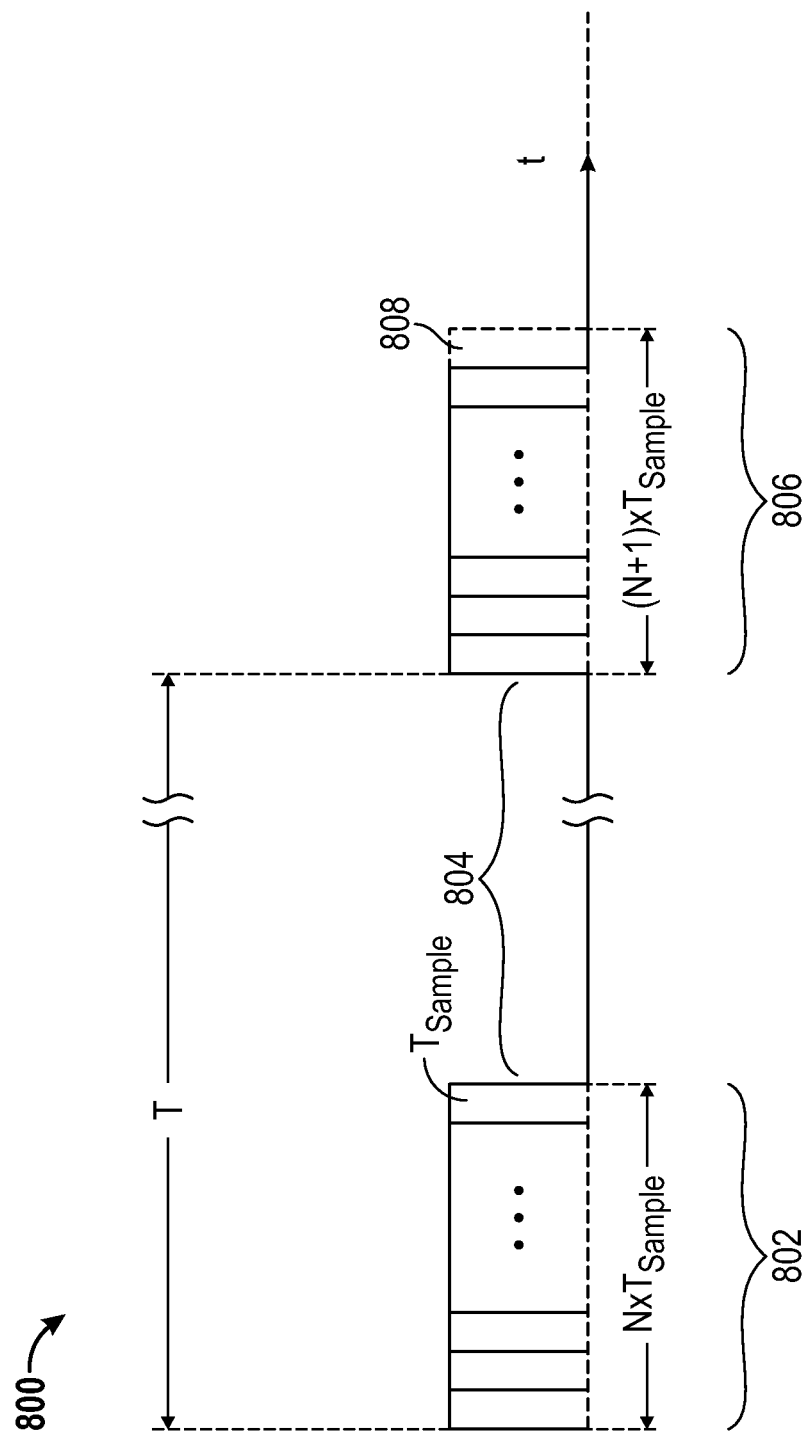
FIG. 8 illustrates generally a timing diagram that can be illustrative of a sampling duration during a first measurement cycle, and a sampling duration of a subsequent measurement cycle.
Figure 10:
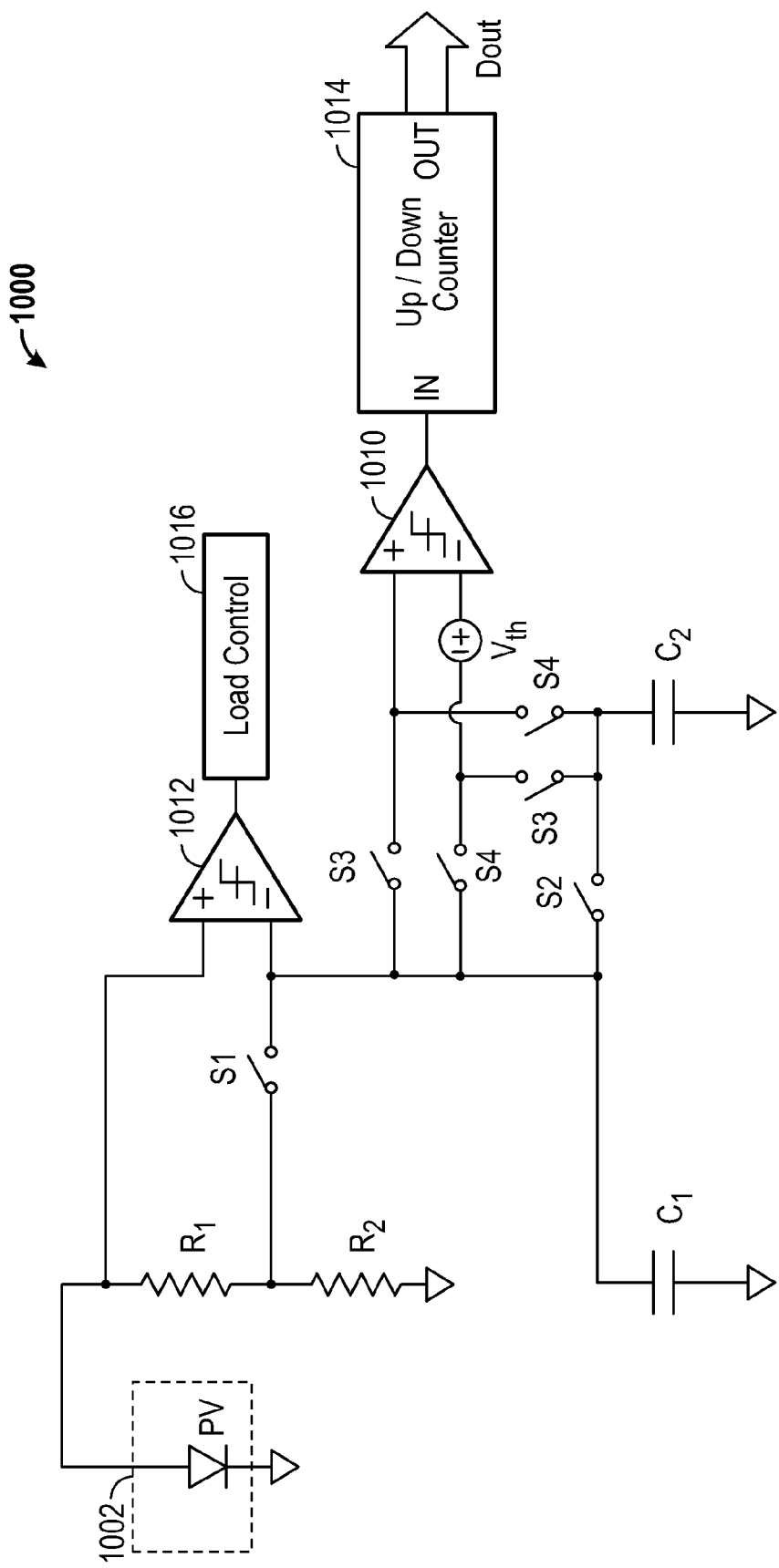
FIG. 10 illustrates generally a measurement circuit, such as can be included as a portion of a power conversion or control circuit.

FIG. 8 illustrates generally a timing diagram that can be illustrative of a first sampling duration 802 during a first measurement cycle, and a second sampling duration 806 of a subsequent measurement cycle. The present inventors have recognized, among other things, that sampling of an open-circuit voltage or other electrical parameter can be accomplished using an adjustable sampling duration, such as shown in FIG. 8, such as for a photovoltaic (PV) energy source. For example, a measurement cycle can be defined by a fixed or variable period that can be represented by "T." Such a period can be fixed, such as around 32 seconds or some other value. In other examples, such a duration can be varied. An inverse of the measurement cycle period can be referred to as a measurement "frequency." During a first measurement cycle, T, the first sampling duration 802 can refer a duration where a load is isolated (e.g., decoupled) from the energy source. The first sampling duration 802 can be described as an integer count, N times a number of fixed increments, $T_{Sample}$, so that the total first duration is $N \times T_{Sample}$. As shown in the example of FIG. 10, the value N can be a count provided by an up/down counter circuit, for example. At the end of the first sampling duration 802, a value corresponding to the open-circuit voltage of the energy source or some other electrical parameter can be sampled or otherwise stored. At 804, for the remainder of the first measurement cycle, T, the load can be recoupled to the energy source. For example, during the portion 804 of the first measurement cycle, a power conversion circuit can be controlled so as to adjust the load presented to the energy source to seek out a target output voltage of the energy source under load, as described in other examples herein.

A subsequent measurement cycle can occur after the first measurement cycle, T. During the subsequent measurement cycle, a different second sampling duration 806 can be used, such as determined using information about the open-circuit voltage obtained during the first measurement cycle, T. For example, if the information indicative of the open-circuit voltage measurement indicates that the open-circuit voltage measurement has changed more than a specified offset (e.g., a threshold), $V_{th}$, from a previous open-circuit voltage measurement, the different second sampling duration 806 can be extended by an additional increment 808 of duration $T_{Sample}$, so that the different second sampling duration is $(N+1) \times T_{Sample}$ in total duration. Similarly, if the open-circuit voltage measurement has changed less than the specified offset, $V_{th}$, then the subsequent measurement cycle can use a sampling duration that is shorter than the first sampling duration 802, as illustrated generally in the examples of FIGS. 9 and 12. In this manner, the sampling duration can be adjusted from measurement cycle to measurement cycle. In an illustrative example, the fixed increment, $T_{Sample}$, can be 128 milliseconds (ms) or some other value.

Figure 9:
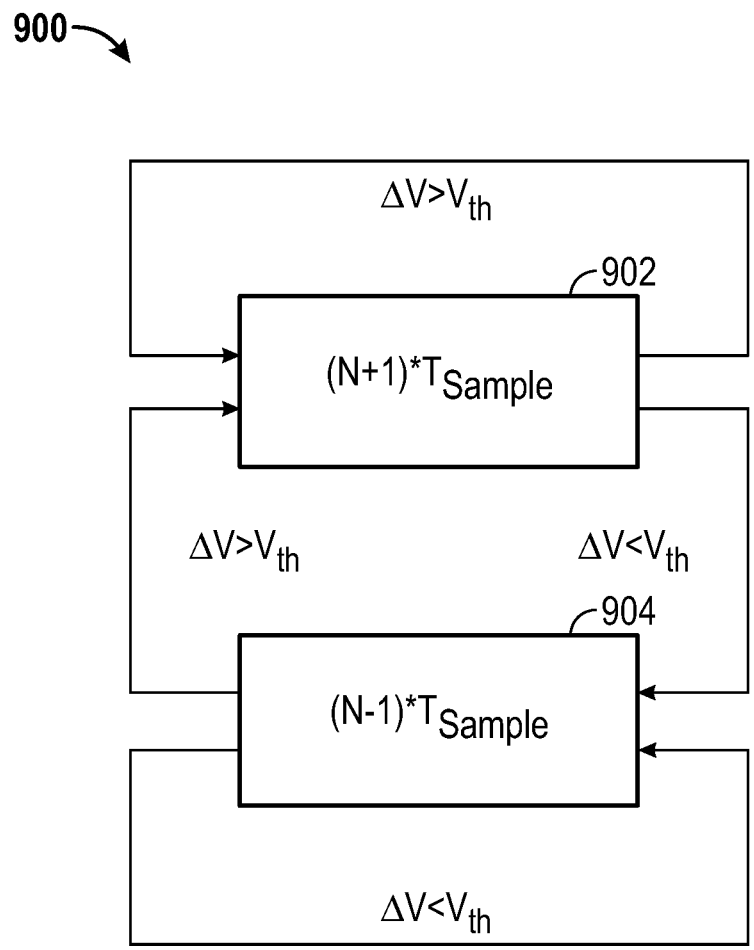
FIG. 9 illustrates generally a technique, such as a method, for determining a sampling duration, such as using information about a voltage difference between open-circuit voltage measurements made during a present measurement cycle and a prior measurement cycle.

FIG. 9 illustrates generally a technique 900, such as a method, for determining a sampling duration, such as using information about a voltage difference between open-circuit voltage measurements made during a present measurement cycle and a prior measurement cycle, and such difference between successive measurements can be represented by "ΔV." As shown in the example of FIG. 8, if the difference between successive measurements of the electrical parameter of an energy source, such as open-circuit voltage, are greater than a threshold, $V_{th}$, then the sampling duration can be incremented at 902, such as by a fixed increment $T_{Sample}$. For example, if the present sampling duration is $N \times T_{Sample}$, then the sampling duration for the subsequent cycle is $(N+1) \times T_{Sample}$. Similarly, at 904, if the difference between successive measurements of the electrical parameter (e.g., open-circuit voltage) are less than the threshold, $V_{th}$, then the sampling duration can be decreased, such as by a fixed increment of $T_{Sample}$, to provide a sampling duration of $(N-1) \times T_{Sample}$. In this manner, the sampling duration is adjusted over successive cycles so that a portion of the open-circuit voltage waveform of the energy source is sampled when the waveform is likely to be changing less significantly (e.g., by less than $V_{th}$), such as shown generally in the illustration of FIG. 13.

FIG. 10 illustrates generally a measurement circuit 1000, such as can be included as a portion of a power conversion or control circuit. One or more portions of the circuit 1000 of FIG. 10 can be co-integrated on a commonly-shared integrated circuit, or within a commonly-shared module, such as along with other portions of a system, such as one or more portions of the example of FIG. 4.

An energy source 1002, such a photovoltaic (PV) device can be coupled to a resistor divider network including resistors R1 and R2. The resistor divider network can be configured to provide a divider ratio R2/(R1+R2) that corresponds to a specified proportion between a measured open-circuit voltage of the energy source 1002, and a target voltage at the energy source 1002 output under load. This proportion, as mentioned elsewhere, can be referred to as "K," and is generally in the range of about 0.73 to 0.8 for PV devices, or can include other values depending on the energy source 1002 and other conditions. The voltage under load of the energy source 1002 can be measured such as using a first input of a first comparator circuit 1012. The second input of the first comparator circuit 1012 can be coupled to a sampling capacitor or can otherwise be provided with a representation of a measured open-circuit voltage times the proportion K. For example, in FIG. 10, when the load is decoupled from the energy source, the resistor divider can scale the open-circuit voltage provided by the energy source 1002, and at the end of a specified sampling duration, a switch controlled by switch control signal S1 can be opened or toggled such as to store a value of the open-circuit voltage scaled by the proportion K on capacitor C1 corresponding to the open-circuit voltage at the end of a specified sampling duration.

The value (e.g., a voltage) stored on capacitor C1 can be transferred to capacitor C2, such as using switch S2. During a subsequent measurement cycle, a new open-circuit voltage sample can be taken and stored on C1, and a difference between open-circuit voltage values stored on C1 and C2 corresponding to a present and a prior measurement cycle, respectively, can be compared to a threshold, $V_{th}$, using switches controlled such as by switch control signals S3 and S4 (see, e.g., FIGS. 11 and 12), and such as using a second comparator 1010 and a voltage reference establishing $V_{th}$. $V_{th}$ can be either fixed or adjustable, such as having a value of about 10 millivolts (mV) when used with a PV device as the energy source 1002, for example.

In cycles where the present open-circuit voltage measurement exceeds the prior open-circuit voltage measurement by more than $V_{th}$, the output of the second comparator 1010 can be used, such as to increment an up/down counter 1014 (e.g., extending a subsequent sampling duration). Similarly, when the present open-circuit voltage measurement does not exceed the prior open-circuit voltage measurement by $V_{th}$, the output of the second comparator 1010 can be used, such as to decrement the up/down counter 1014 (e.g., shortening a subsequent sampling duration). For example, the counter can be triggered, gated, or strobed, such as to decrement in response to a falling edge or low logic level output of the second comparator 1010, or to increment in response to a rising edge or high logic level output of the second comparator 1010. Examples of each sequence of switch control signals for the incrementing and decrementing behavior are shown illustratively in FIGS. 11 and 12. The output of the counter circuit 1014, $D_{out}$, can be represented as "N" for a present measurement cycle, and can be used to establish an open-circuit voltage sampling duration for a subsequent measurement cycle, such as to provide a total sampling duration as a multiple of N times a specified increment, $T_{Sample}$, as discussed in other examples.

Figure 11:
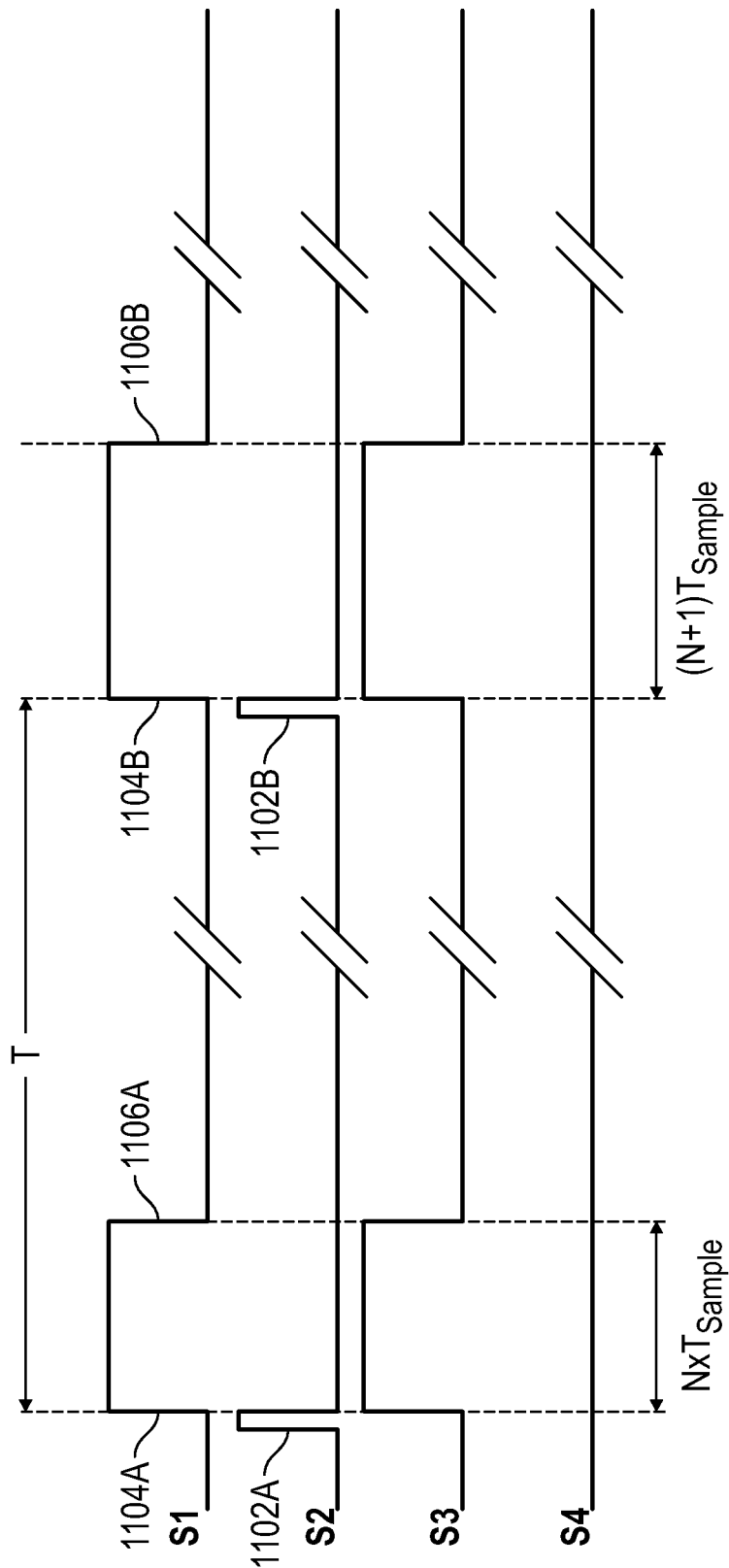
FIG. 11 illustrates generally an illustrative example of a sequence of switch control signals, including increasing a sampling duration in a measurement cycle, such as can be used to control or describe the states of switches S1 through S4 as shown in FIG. 10, such as in response to a comparison between a present open-circuit voltage measurement and a prior open-circuit voltage measurement, such as shown in FIG. 9.

FIG. 11 illustrates generally an illustrative example of a sequence of switch control signals, including increasing a sampling duration in a measurement cycle, such as can be used to control or describe the states of switches controlled by signals S1 through S4 as shown in FIG. 10, such as in response to a comparison between a present open-circuit voltage measurement and a prior open-circuit voltage measurement, such as shown in FIG. 9. Just before a first measurement cycle, such as defined by a period, T, switch control signal S2 can be toggled to transfer a voltage stored on capacitor C1 to capacitor C2. Then, at 1104A, switch control signals S1, S3, and S4 can be held high for a duration corresponding to a first sampling duration. The first sampling duration can be determined using a count provided by the up/down counter shown in FIG. 10, for example, to provide a duration N×$T_{Sample}$.

During this first sampling duration, a new open-circuit voltage measurement is stored on C1, and contemporaneously, a difference between the present and prior open-circuit voltage measurements can be compared with the threshold in response to switch control signals S3 and S4. In the example of FIG. 11, such a comparison indicates that at the expiration 1106A of the first sampling duration, the difference between the present open-circuit voltage measurement and a prior open-circuit voltage measurement is greater than the threshold, $V_{th}$. The count N can be incremented by one count in response to the comparison. The new value of C1 is transferred to C2 at 1102B, and during a subsequent measurement cycle beginning at 1104B, a different second sampling duration is extended in duration by an increment of $T_{Sample}$, to provide an expiration 1106B at (N+1)$T_{Sample}$, corresponding to the incremented count (N+1) times $T_{Sample}$.

Figure 12:
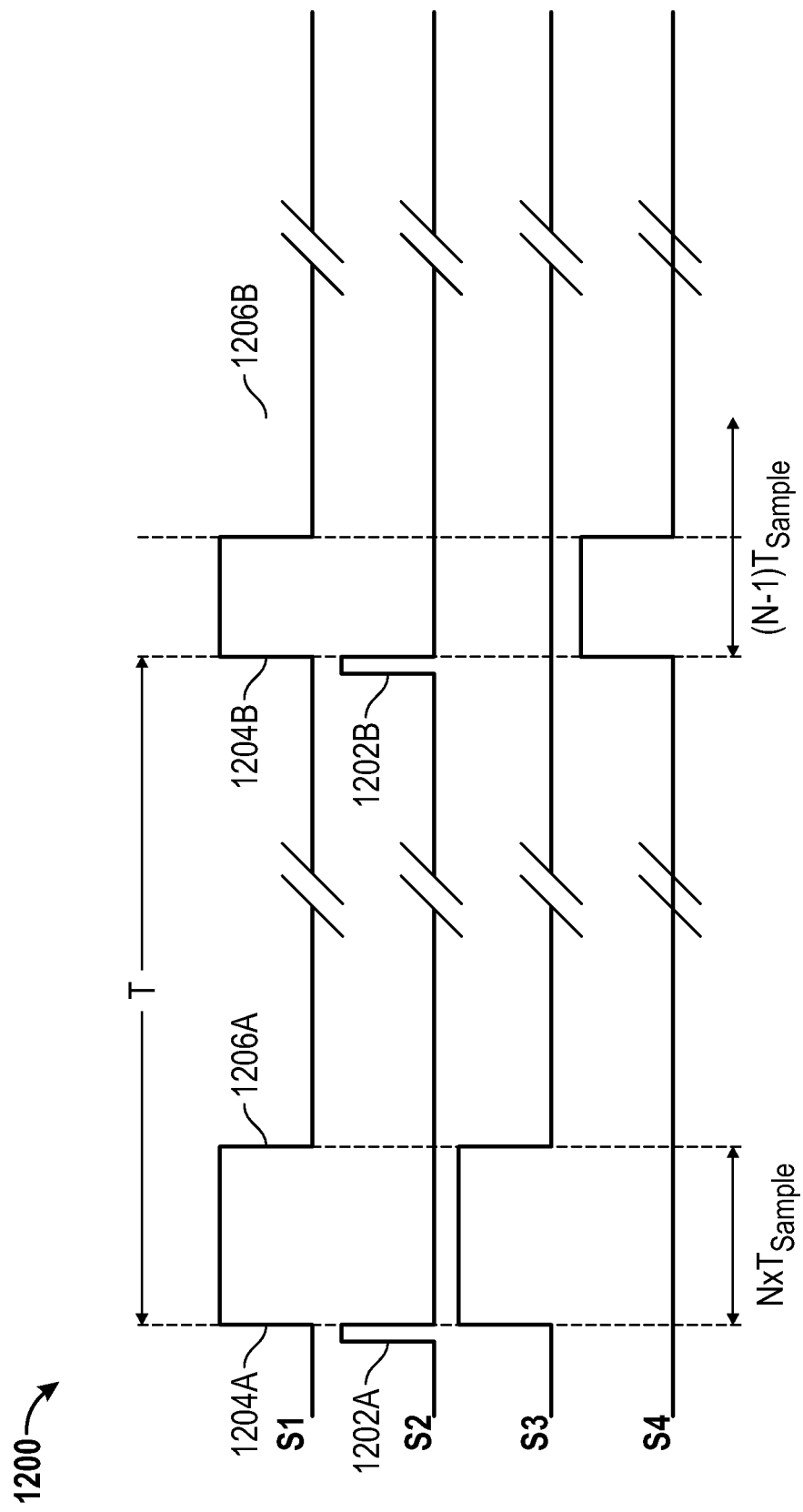
FIG. 12 illustrates generally an illustrative example of a sequence of switch control signals, including decreasing a sampling duration in a measurement cycle, such as can be used to control or describe the states of switches S1 through S4 as shown in FIG. 10, such as in response to a comparison between a present open-circuit voltage measurement and a prior open-circuit voltage measurement, such as shown in FIG. 9.

FIG. 12 illustrates generally an illustrative example of a sequence of switch control signals, including decreasing a sampling duration in a measurement cycle, such as can be used to control or describe the states of switches controlled by signals S1 through S4 as shown in FIG. 10, such as in response to a comparison between a present open-circuit voltage measurement and a prior open-circuit voltage measurement, such as shown in FIG. 9. As in FIG. 11, the voltage stored on C1 can be transferred to C2 by toggling switch control signal S2 at 1202A. At 1204A, switch control signals S1, S3, and S4 can be held high such as to establish the first sampling duration N×$T_{Sample}$, as in the example of FIG. 11. In contrast to the example of FIG. 11, in FIG. 12, a difference between the present and prior open-circuit voltage measurements indicates that at the expiration 1206A of the first sampling duration, the difference between the present open-circuit voltage measurement and a prior open-circuit voltage measurement is less than the threshold, $V_{th}$, during the first measurement cycle, T. At 1202B, the value stored on C1 can be transferred to C2, and at 1204B, a subsequent measurement cycle can use a second sampling duration decreased by a fixed increment, such as having a duration (N−1)×$T_{Sample}$ expiring at 1206B. In this manner, the circuit shown in the example of FIG. 10 and the techniques, such as shown in FIGS. 8 through 9, can be used to dynamically adjust an open-circuit sampling duration from measurement cycle to measurement cycle. The open-circuit voltages measured, such as at the expirations 1106A, 1106B, 1206A, or 1206B can be used with the proportion, K, to provide a target output voltage for the energy source. For example, as discussed above, a load presented to the energy source can be varied so that the output voltage of the energy source approaches a specified or desired target output voltage corresponding to a maximum power point or so as to drive the output voltage of the energy source toward a maximum power point.

Figure 13:
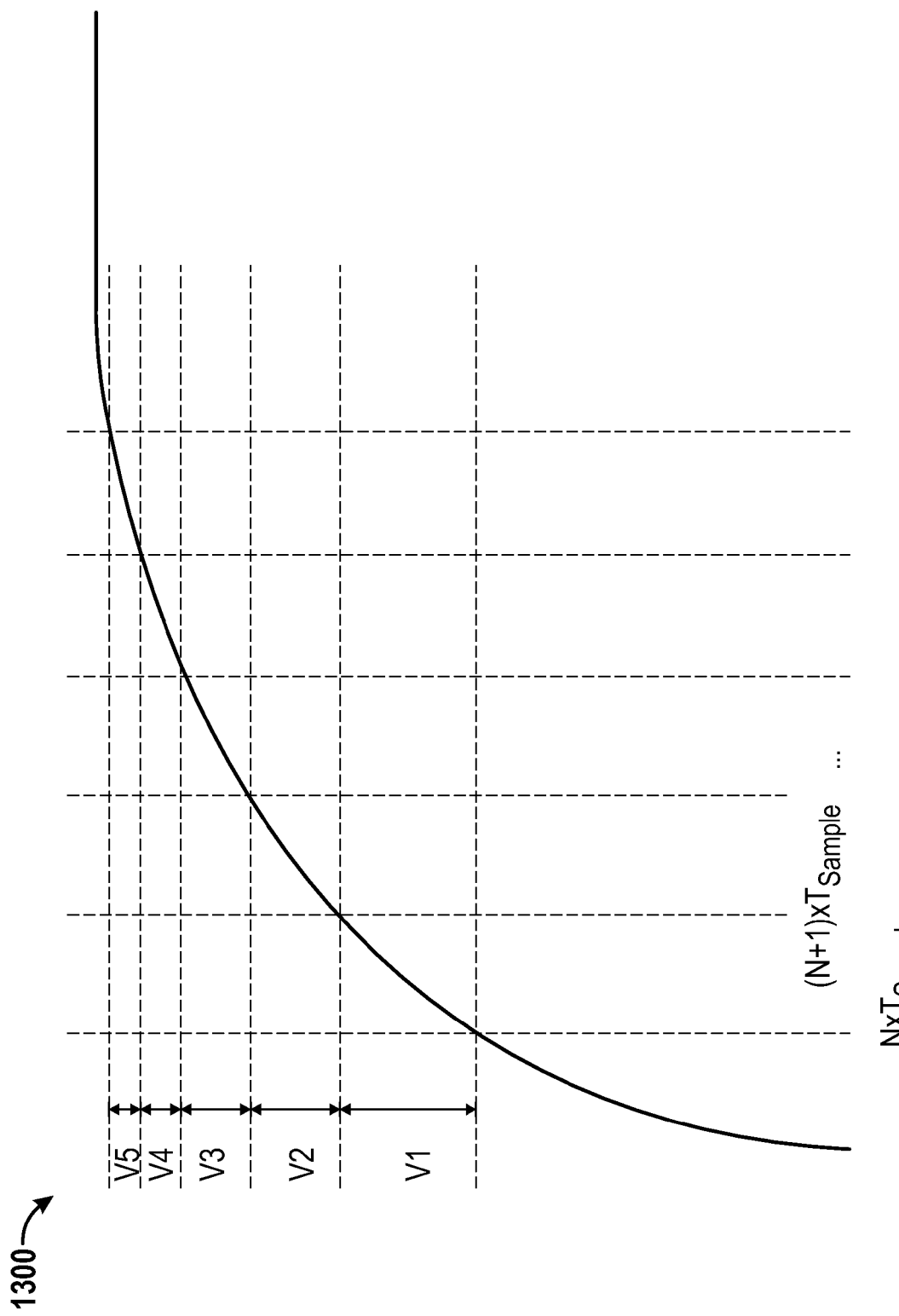
FIG. 13 illustrates generally an illustrative example of a time response of a terminal voltage of a photovoltaic (PV) device, along with successively increasing sample durations overlaid on the time response, and a corresponding change in measured open-circuit voltage for successive increments in sample duration.

FIG. 13 illustrates generally an illustrative example of a time response 1300 of a terminal voltage of a photovoltaic (PV) device, along with successively increasing sample durations overlaid on the time response 1300, and a corresponding change in measured open-circuit voltage for successive increments in sample duration. Using the techniques and apparatus shown in other examples, a difference between a first sampling duration $N \times T_{Sample}$ and a second sampling duration $(N+1) \times T_{Sample}$ can result in $\Delta V$ in a measured open-circuit voltage of V1. V1 is relatively large because these open-circuit voltages are being made before the energy source has had time to settle, such as just after a load is isolated (e.g., decoupled) from the energy source. Accordingly, if V1 exceeds a specified threshold, $V_{th}$, the sample duration can be extended by a fixed increment for the next cycle, to provide a sampling duration of $(N+2) \times T_{Sample}$. The difference between the next successive set of open-circuit measurements can be represented by a voltage difference, V2. V2 may still be larger than $V_{th}$, and the sampling interval can be extended by another fixed increment to provide a sampling duration of $(N+3) \times T_{Sample}$. As shown in FIG. 13, each successive voltage difference, V3, V4, V5 gets smaller as sampling time increases and as the open-circuit voltage measurement asymptotically converges on the actual steady state open-circuit voltage of the energy source, over a succession of cycle. For example, if the difference V4 is less than the threshold, $V_{th}$, the sample duration $(N+4) \times T_{Sample}$ can be decremented back to $(N+3) \times T_{Sample}$, rather than increased to $(N+5) \times T_{Sample}$. If the difference V4 is greater than the threshold, $V_{th}$, then the sample duration $(N+4) \times T_{Sample}$ can be incremented to $(N+5) \times T_{Sample}$, and so on.

The threshold, $V_{th}$, can be specified so as to provide a desired level of efficiency trading off a total sampling duration with an accuracy of the open-circuit voltage measurement. For example, a shorter sampling duration can reduce inefficiency by shortening the open-circuit sampling duration, but at the expense of underestimating the open-circuit voltage and therefore creating error in a resulting target voltage for operation of the energy source under load. Conversely, a longer sampling duration can reduce inefficiency by providing a better estimate of the actual steady-state open-circuit voltage, but at the expense of a long sampling duration, creating a long duration where power transfer is inhibited between the energy source and the load.

Additional Notes

Each of the non-limiting examples discussed in this document can stand on its own, or can be combined in various permutations or combinations with one or more of the other examples. The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with The claimed invention is:

1. A method of controlling measurement of an electrical parameter of an energy source to obtain information for use in enhancing a power transfer efficiency between the energy source and a load, the method comprising:
    during a first measurement cycle, obtaining information indicative of the electrical parameter of the energy source using a measurement circuit during a first sampling duration in which the load is decoupled from the energy source;
    comparing the information indicative of the obtained electrical parameter with a threshold; and
    in response to the comparing, determining a different second sampling duration for use in obtaining information indicative of the electrical parameter during a subsequent measurement cycle wherein the different second sampling duration is capable of being specified without requiring adjustment of a duration of the first or subsequent measurement cycle;
    wherein the information indicative of the electrical parameter of the energy source includes information for use in enhancing the power transfer efficiency between the energy source and the load.

2. The method of controlling sampling of claim 1, wherein the determining the second sampling duration includes establishing a second sampling duration increased or decreased by a specified increment with respect to the first sampling duration.

3. The method of controlling sampling of claim 2, wherein the threshold is established using information indicative of the electrical parameter during a prior measurement cycle and a specified offset.

4. The method of controlling sample of claim 3, wherein establishing the second sampling duration includes increasing the second sampling duration in response to the comparison when the comparison indicates that the information indicative of the electrical parameter for the first measurement cycle differs from the information indicative of the electrical parameter for the previous cycle by more than the specified offset.

5. The method of claim 3, wherein the determining the second sampling duration in response to the comparing includes:
    incrementing a count of a counter circuit when the comparing indicates that the information indicative of the obtained electrical parameter exceeds the threshold; and
    decrementing a count of the counter circuit when the comparing indicates that the information indicative of the obtained electrical parameter does not exceed the threshold; and
    wherein the second sample duration is established using the count.

6. The method of controlling sampling of claim 1, comprising:
    decoupling the load from the energy source during the first sampling duration during the first measurement cycle;
    recoupling the load after the first sampling duration; and
    decoupling the load from the energy source during the second sampling duration during the subsequent measurement cycle.

7. The method of claim 1, comprising storing energy from the energy source in an energy storage circuit; and
    adjusting one or more of a frequency or a duration of instances where the load is coupled to the energy source in order to enhance power transfer efficiency using the information indicative of the electrical parameter of the energy source obtained during the first sampling duration.

8. The method of claim 7, wherein the electrical parameter of the energy source includes an open-circuit voltage provided at output terminals of the energy source; and
    wherein adjusting one or more of a frequency or duration of instances where the load is coupled to the energy source includes:
    comparing a voltage-under-load provided at the output terminals of the energy source with the open-circuit voltage obtained during the first measurement cycle;
    decreasing a frequency or duration of instances where the load is coupled to the energy source when the voltage-under-load is lower in magnitude than a specified value proportional to the open-circuit voltage;
    increasing a frequency or duration of instances where the load is coupled to the energy source when the voltage-under-load exceeds a specified value proportional to the magnitude of the open-circuit voltage; and
    supplying the load with energy using the energy storage circuit at least when the load is decoupled from the energy source;
    wherein the specified value proportional to the magnitude of the open-circuit voltage is established at least in part using a specified proportionality constant.

9. The method of claim 8, wherein the specified proportionality constant is determined at least in part using information about one or more of an irradiance or temperature in an environment around the energy source.

10. The method of claim 9, wherein the specified proportionality constant is adjusted dynamically in response to changes in one or more of a monitored irradiance or a monitored temperature.

11. The method of claim 8, wherein obtaining the information indicative of the electrical parameter includes sampling a representation of the open-circuit voltage and storing the representation using a first sampling capacitor;
    wherein comparing the voltage-under-load provided at the output terminals of the energy source with the open-circuit voltage obtained during the first measurement cycle includes comparing the stored representation from the first sampling capacitor with the voltage-under-load; and
    wherein one of the stored representation from the first sampling capacitor or the voltage-under-load is scaled by the specified proportionality constant.

12. The method of claim 1, wherein the energy source includes a photovoltaic (PV) device or a thermoelectric generator (TEG).

13. A system configured to control sampling of an electrical parameter of an energy source to obtain information for use in enhancing a power transfer efficiency between the energy source and a load, the system comprising:
    a measurement circuit configured to obtain information indicative of the electrical parameter of the energy source during a first sampling duration in which the load is decoupled from the energy source, the measurement circuit including a first comparator circuit configured to compare the information indicative of the obtained electrical parameter with a threshold; and
    a control circuit coupled to the comparator circuit, the control circuit configured to control coupling of a load to the energy source and configured to determine, in response to a comparison by the comparator circuit, a second sampling duration for use by the measurement circuit in obtaining information indicative of the electrical parameter during a subsequent measurement cycle, wherein the different second sampling duration is capable of being specified without requiring adjustment of a duration of the first or subsequent measurement cycle;

wherein the information indicative of the electrical parameter of the energy source includes information for use in enhancing the power transfer efficiency between the energy source and the load.

14. The system of claim 13, wherein the control circuit is configured to establish the second sampling duration by increasing or decreasing the second sampling duration by a specified increment with respect to the first sampling duration.

15. The system of claim 14, wherein the control circuit is configured to establish the threshold using information indicative of the electrical parameter during a prior measurement cycle and a specified offset.

16. The system of claim 15, wherein the control circuit is configured to establish the second sampling duration including increasing the second sampling duration in response to a comparison provided by the first comparator circuit when the comparison indicates that the information indicative of the electrical parameter for the first measurement cycle differs from the information indicative of the electrical parameter for the previous cycle by more than the specified offset.

17. The system of claim 14, comprising a counter circuit coupled to the output of the comparator circuit, the counter configured to a increment a count when the comparison indicates that the information indicative of the obtained electrical parameter exceeds the threshold, and decrement the count when the comparing indicates that the information indicative of the obtained electrical parameter does not exceed the threshold, and wherein the second sample duration is established using the count.

18. The system of claim 13, further comprising a photovoltaic (PV) device or a thermoelectric generator (TEG).

19. The method of controlling sampling of claim 1, wherein the sampling duration is capable of dynamic cycle-to-cycle adjustment between measurement cycles.

20. The method of controlling sampling of claim 1, wherein the sampling duration is adjusted by selecting a measurement duration using at least one of: information about a settling time for the energy source, a limit on extending the measurement cycle, or a limit on truncating the measurement cycle.

21. The method of controlling sampling of claim 1, wherein the frequency of measurement cycles is capable of being adjusted in response to change in one or more environmental factors.

22. A method of controlling measurement of an electrical parameter of an energy source to obtain information for use in enhancing a power transfer efficiency between the energy source and a load, the method comprising:

during a first measurement cycle, obtaining information indicative of the electrical parameter of the energy source using a measurement circuit during a first sampling duration in which the load is decoupled from the energy source;

comparing the information indicative of the obtained electrical parameter with a threshold; and in response to the comparing, determining a different second sampling duration for use in obtaining information indicative of the electrical parameter during a subsequent measurement cycle;

wherein the sampling duration is capable of dynamic cycle-to-cycle adjustment between measurement cycles;

wherein the sampling duration is adjusted by selecting a measurement duration using at least one of: information about a settling time for the energy source, a limit on extending the measurement cycle, or a limit on truncating the measurement cycle; and wherein the different second sampling duration is capable of being specified without requiring adjustment of a duration of the first or subsequent measurement cycle.

23. The method of controlling sampling of claim 22, wherein the frequency of the measurement cycles is adjustable in response to change in one or more environmental factors.

* * * * *